United States Patent [19]
McGregor

[11] Patent Number: 4,780,672
[45] Date of Patent: Oct. 25, 1988

[54] LASER DRIVEN HELIUM MAGNETOMETERS

[75] Inventor: Douglas D. McGregor, Plano, Tex.

[73] Assignee: Texas Instruments Incorporated, Dallas, Tex.

[21] Appl. No.: 44,914

[22] Filed: Apr. 30, 1987

[51] Int. Cl.$^4$ .............................................. G01R 33/26
[52] U.S. Cl. ..................................... 324/304; 324/301
[58] Field of Search ............... 324/300, 301, 302, 304; 331/3, 25

[56] References Cited

U.S. PATENT DOCUMENTS

| | | | |
|---|---|---|---|
| 3,173,082 | 3/1965 | Bell et al. | 324/304 |
| 3,728,614 | 4/1973 | Hearn | 324/304 |
| 4,005,355 | 1/1977 | Happer et al. | 324/304 |
| 4,193,029 | 3/1980 | Cioccio | 324/301 |
| 4,327,327 | 5/1983 | Greenwood et al. | 324/304 |
| 4,430,616 | 2/1984 | Grover | 324/300 |
| 4,567,439 | 4/1986 | McGregor | 324/304 |

OTHER PUBLICATIONS

Polarization of He$^3$ Gas by Optical Pumping, F. D. Colegrove et al.—Physical Review, vol. 132, No. 6.
Optical Pumping of Helium in the $^3S_1$ Metastable State, F. D. Colegrove et al., Physical Review, vol. 119, No. 2.
Physical Review Letters, vol. 1, No. 9.
Optical Pumping, William Happer, Reviews of Modern Physics, vol. 14, No. 2.

Primary Examiner—Michael J. Tokar
Attorney, Agent, or Firm—René E. Grossman; James T. Comfort; Melvin Sharp

[57] ABSTRACT

A helium magnetometer includes a helium cell containing helium, preferable $^4$He. A solid state laser strikes the helium cell at one end with a laser having a wave length of 1082.91 nm in the embodiment of a $^4$He cell. The helium atoms precess at known frequencies for different magnetic fields. The transparency of the helium cell at 1082.91 nm with $^4$He is a function of the resonance of the atoms within the helium cell. A radiation detector positioned on a second end of the helium cell opposite the end where the laser strikes detects the laser when transmitted through the helium cell and produces an electrical signal in response to the transmitted laser. The resonance of the helium cell is enhanced by a Voltage Controlled Oscillator, VCO, which provides a variable output frequency to a pair of coils positioned on the sides of the helium cell and electrically connected to the VCO to receive the variable output frequency. The pair of coils produces a variable magnetic field at the precession frequency that is mathematically related to the magnetic field that is being measured and thus enhances the precession of the atoms within the helium cell. A feedback loop includes a demodulation circuit that is electrically connected between the radiation detector and the VCO and demodulates the electrical signal from the radiation detector to produce a drive voltage for driving the VCO.

19 Claims, 2 Drawing Sheets

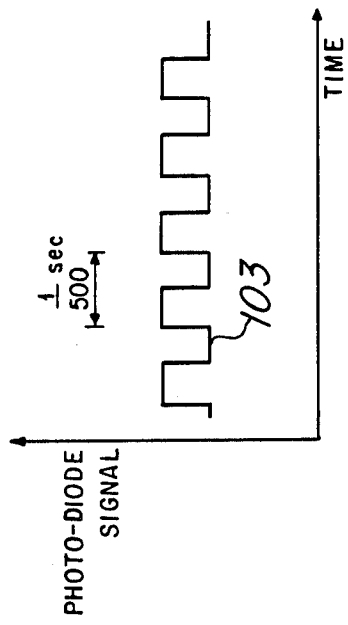
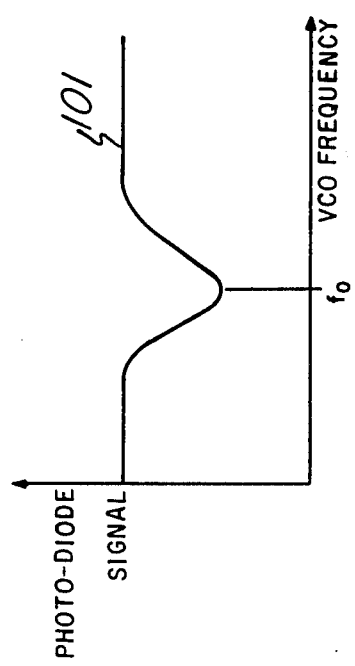
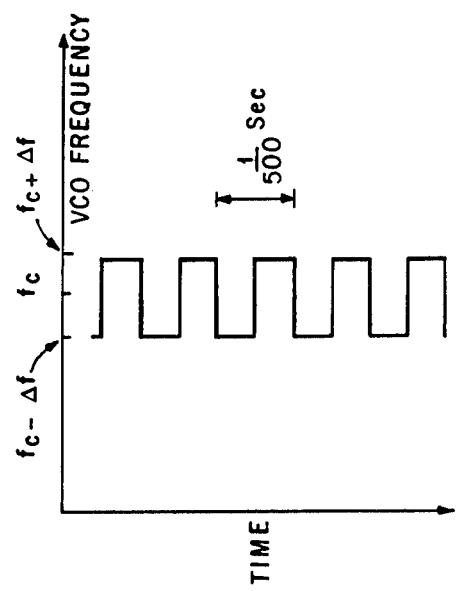

LASER DRIVEN HELIUM MAGNETOMETERS

BACKGROUND OF THE INVENTION

This invention relates to magnetometers and more particularly to laser driven helium magnetometers.

Conventional helium magnetometers use a $^4$He lamp (a tube containing $^4$He gas which is excited by a rf discharge so that it glows) to provide radiation to polarize either the $^4$He metastable atoms or ground state $^3$He atoms in the cell. The physics of this process is known in the art and described in such publication as:

P. A. Franken and F. D. Colegrove, *Physics Review Letters*, 1, 317 (1958);

F. D. Colegrove and P. A. Franken *Physics Review* 119, 680 (1960); and

F. D. Colegrove, L. D. Schearer and G. K. Walters, *Physics Review* 132, 2561 (1963).

Conventional helium magnetometers use what is referred to as a lamp pumping technique. There are several disadvantages associated with the lamp pumping technique. The lamp radiant intensity is less than optimum for many applications and the lamp radiation contains spectral lines corresponding to the $2^3S_1$-$2^3P_0$, $2^3S_1$-$2^3P_1$, and $2^3S_1$-$2^3P_2$, transitions of $^4$He. Radiation of all three transition wavelengths is less effective than radiation of one transitional wavelength. Reference may be made to W. Happer, *Review of Modern Physics* 44, 169 (1972).

SUMMARY OF THE INVENTION

A helium magnetometer includes a helium cell containing helium, preferable $^4$He. A solid state laser strikes the helium cell at one end with a laser having a wave length of 1082.91 nm in the embodiment of a $^4$He cell. The helium atoms precess at known frequencies for different magnetic fields. The transparency of the helium cell at 1082.91 nm with $^4$He is a function of the resonance of the atoms within the helium cell. A radiation detector positioned on a second end of the helium cell opposite the end where the laser strikes detects the laser when transmitted through the helium cell and produces an electrical signal in response to the transmitted laser. The resonance of the helium cell is enhanced by a Voltage Controlled Oscillator, VCO, which provides a variable output frequency to a pair of coils positioned on the sides of the helium cell and electrically connected to the VCO to receive the variable output frequency. The pair of coils produces a variable magnetic field at the precession frequency that is mathematically related to the magnetic field that is being measured and thus enhances the precession of the atoms within the helium cell. A feedback loop includes a demodulation circuit that is electrically connected between the radiation detector and the VCO and demodulates the electrical signal from the radiation detector to produce a drive voltage for driving the VCO.

The VCO is frequency modulated by a 500 Hz signal which is the output from a 500 Hz oscillator and thus sweeps, at a rate of 500 cycles per second, across a band of frequencies to locate a center frequency at the frequency that corresponds to the magnetic field that is being measured.

The 500 Hz signal is also used to demodulate the electric signal from the radiation detector which in the embodiment shown is a photo-diode.

A frequency counter counts the output signal from the VCO and the magnetic field that the magnetometer is measuring is mathematically related to the measured frequency.

These and other features and advantages will be more apparent from a reading of the specification in conjunction with the figures in which:

BRIEF DESCRIPTION OF THE FIGURES

FIGS. 2a, 2b and 2c are waveform diagrams illustrating the operation of the helium magnetometer of FIG. 1.

DETAIL DESCRIPTION OF THE EMBODIMENTS

Figure 1:
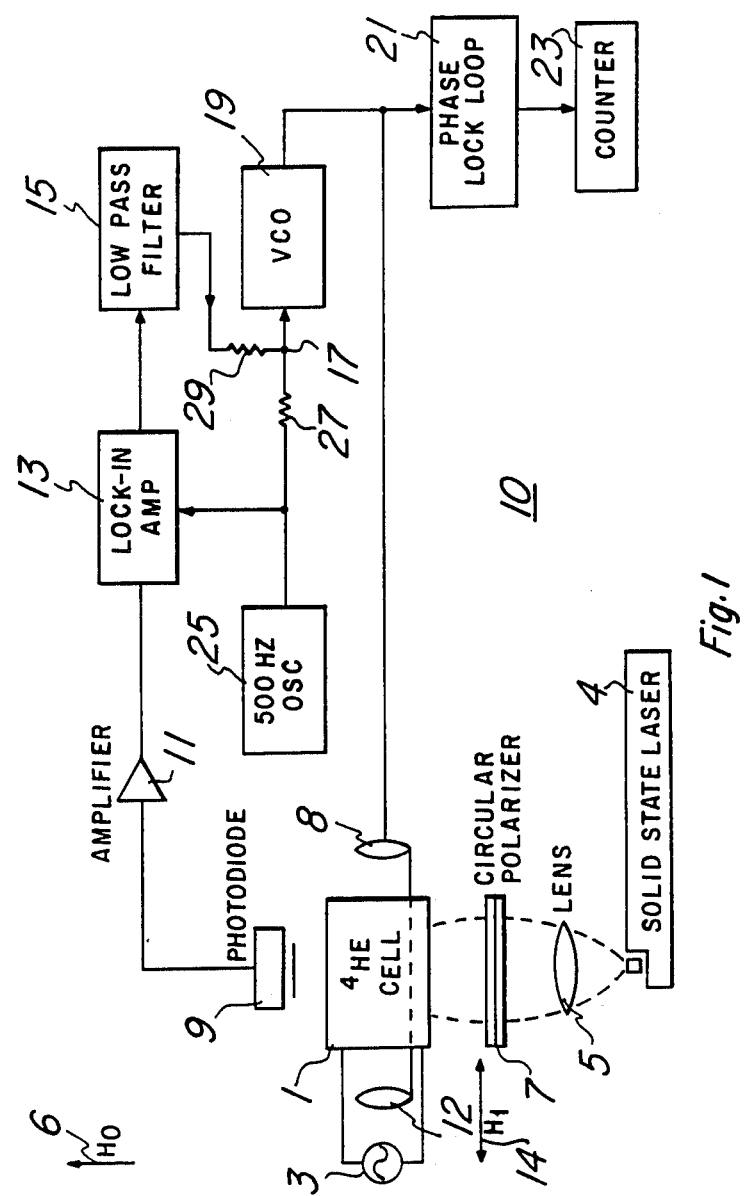
FIG. 1 is a block diagram of the helium magnetometer according to the invention.

Referring to FIG. 1, a helium cell 1 which contains $^4$He is excited by an RF oscillator 3 to the metastable state or the $2^3S_1$ level. A solid state laser 4 radiates at a wavelength of 1082.91 nm which is the wavelength that corresponds to one of the $2^3S$-$2^3P$ spectral lines of helium. The output of the solid state laser 4 is collimated by a lens 5 and circularly polarized by a circular polarizer 7 before striking the helium cell 1. The absorption of the energy provided by the polarized radiation from the solid state laser tends to polarize the helium cell's 1 atoms. It should be noted that the solid state laser is applied in the direction of the magnetic field that is being measured H$_0$ as indicated by arrow 6. The strength of the magnetic field, H$_0$, that is represented by the arrow 6 is measured and determined by counting the output frequency of a Voltage Control Oscillator, VCO 19, with a counter 23 when there is a resonance condition within the helium cell 1. The frequency of this resonance condition is established and detected through the operation of the circuit illustrated in FIG. 1 which should be used in conjunction with FIGS. 2a–2c for a more complete understanding of the invention.

The output of the voltage control oscillator, VCO 19, is applied to side coils 8 and 12 which provides a varying magnetic field indicated by arrow 14 and noted by H$_1$. This varying magnetic field, H$_1$, causes the metastable $^4$He atoms within the helium cell 1 which are in the metastable state through the absorption of the energy provided by the rf oscillator 3, polarized by the radiation provided by the solid state laser 4 in the direction of the magnetic field that is being measured, H$_0$, to precess. When the frequency of the varying magnetic field H$_1$ that is produced by the oscillating current that is applied to the field windings 8 and 12 causes the metastable atoms to precess, the transparency of the helium within the cell 1 becomes more absorptive to radiation having a wavelength of 1082.91 nm than at non resonance conditions, the condition when enough helium atoms are precessing at the same frequency and alignment to be detectable.

The radiation that is transmitted through the helium cell and also the absence thereof at resonance is detected by a photo-diode 9, amplified by an amplifier 11 and applied to a demodulator circuit that includes a lock-in amplifier 13 which provides a multiplication function and multiplies the output of the amplifier 11 with the output of a 500 Hz oscillator 25 to obtain a product signal that is filtered by a low pass filter 15. The output of the low pass filter 15 is a D.C. signal that is mixed with the output of the 500 Hz oscillator 25 to produce a control voltage for the VCO 19.

As stated previously, at resonance the helium within the $^4$He cell 1 becomes absorptive to the transmission of 1082.91 nm radiation that is provided by the solid state laser 4. This is illustrated in FIG. 2a to which reference should now be made. In FIG. 2a waveform 101 illustrates the output signal strength of the photo-diode 9 as a function of the output frequency of the VCO 19. As can be seen from waveform 101 at $f_0$, the resonant frequency is mathematically related to the magnetic field $H_0$ due to the precession of the metastable atoms and the output signal from the low pass filter 15 that represents the signal strength of the output signal from the photo-diode 9 is at a minimum. At other times, the output signal of the photo-diode 9 or the input to the lock-in amplifier 13, is a square wave that oscillates at 500 Hz and rides on a D.C. level as is represented by waveform 103 of FIG. 2c. This 500 Hz signal, when applied to the VCO 19, causes the frequency of the VCO 19 to locate and oscillate around the center frequency $f_0$ of the resonance of the $^4$He atoms in response to the magnetic field $H_0$. The oscillator will oscillate across a band of from $f_c - \Delta f$ to $f_c + \Delta f$ where $f_c$ in one embodiment that is used to detect perturbations in the earth magnetic field is 1.5 MHz and $\Delta f$ is 1.5 KHz. This is illustrated in FIG. 2c.

In addition, the helium cell 1 is a double resonance cell: one resonance condition is due to the precession of the metastable $^4$He atoms and the other is due to the effect of circular polarized radiation from the solid state laserr 4 on the helium atoms. The strength of the magnetic field $H_0$ will cause the helium atoms to tend to precess at a frequency that is mathematically related to the strength of the magnetic field. When the precession frequency due to the magnetic field $H_0$ equals the varying frequency of $H_1$, then the helium cell is in resonance and thus reduces the transmission of radiation through it, causing a dip in the output from the photo-diode 9. The operation of a feedback loop that includes the photo-diode 9, the amplifier 11, the lock in amplifier 13, the low pass filter 15 in combination with the VCO 19 drives the VCO to the precession frequency, $f_0$, to oscillate at a 500 Hz rate around the precession frequency, $f_0$. (The VCO provides essentially an FM output due to the combination of the feedback signal and the 500 Hz signal and the response thereto by the VCO 19.) A phase lock loop filter 21 performs an FM demodulation on this oscillating frequency to remove the 500 Hz component and applies the FM demodulated output to a counter 23 which can then determine the frequency $f_0$ of the VCO 19 and the strength of the magnetic field $H_0$ as represented by the arrow 6, thus achieving a helium magnetometer that uses optically pumped $^4$He gas which has a low power requirement required to operate the sensor.

The selection of the band of frequencies for the VCO 19 determines the range and magnetic field strength that the helium magnetometer can be used to detect.

I claim:
1. A helium magnetometer comprising:
    a helium cell containing helium at a predetermined energy state;
    a solid state laser having a predetermined wave length and positioned to strike the helium cell on a first end in line with the direction of a magnetic field that is to be measured with coherent radiation produced by the solid state laser;
    a radiation detector positioned on a second end of the helium cell opposite the first end;
    a VCO;
    a first and second coil positioned on the sides of the helium cell and electrically connected to the VCO; and
    a demodulation circuit electrically connected between the radiation detector and the VCO.

2. The helium magnetometer according to claim 1 wherein the helium cell is filled with $^4$He atoms.

3. The helium magnetometer according to claim 2 wherein the predetermined wave length is approximately 1083 nm.

4. The helium magnetometer according to claim 1 further comprising an oscillator electrically connected to the VCO.

5. The helium magnetometer according to claim 4 further comprising a counter electrically connected to the VCO.

6. The helium magnetometer according to claim 1 further including a collimating lens and a circularly polarizer for circular polarizing the radiation produced by the solid state laser.

7. The helium magnetometer according to claim 1 further including an rf oscillator electrically connected to transmit electrical energy to the helium cell.

8. A helium magnetometer means for measuring a magnetic field comprising:
    a helium cell means for containing helium at a predetermined energy state;
    a laser means for providing polarized radiation having a predetermined wave length and positioned for striking the helium cell on a first end in line with the direction of the magnetic field with the polarized radiation;
    a radiation detector positioned on a second end of the helium cell opposite the first end for detecting the polarized radiation when transmitted through the helium cell and for producing an electrical signal in response to the transmitted polarized radiation;
    a VCO for providing a variable output frequency;
    a first and second coil positioned on the sides of the helium cell and electrically connected to the VCO to receive the variable output frequency for producing a variable magnetic field in response to the variable output frequency; and
    a demodulation circuit electrically connected between the radiation detector and the VCO for demodulating the electrical signal to produce a drive voltage for driving the VCO.

9. The helium magnetometer according to claim 8 wherein the helium cell is filled with $^4$He.

10. The helium magnetometer according to claim 9 wherein the predetermined wave length is approximately 1083 nm.

11. The helium magnetometer according to claim 8 further comprising an oscillator means electrically connected to the VCO for sweeping the VCO across a first predetermined band of frequencies and at a first predetermined rate.

12. The helium magnetometer according to claim 11 further comprising a means for counting the variable output frequency.

13. The helium magnetometer according to claim 8 further including a collimating lens and a circular polarizer for circularly polarizing the radiation produced by the solid state laser.

14. The helium magnetometer according to claim 8 further including an rf oscillator electrically connected to the helium cell for energizing the helium cell.

15. A method of measuring a magnetic field comprising the steps of:
   containing helium at a predetermined energy state in a helium cell;
   providing a polarized radiation having a predetermined wave length and positioned for striking the helium cell on a first end in the direction of the magnetic field with a solid state laser;
   detecting the polarized radiation when transmitted through the helium cell and producing an electrical signal in response to the transmitted polarized radiation with a radiation detector positioned on a second end of the helium cell opposite the first end;
   providing a variable output frequency with a VCO;
   producing a variable magnetic field in response to the variable output frequency with a first and second coil positioned on the sides of the helium cell and electrically connected to the VCO to receive the variable output frequency; and
   demodulating the electrical signal to produce a drive voltage for driving the VCO with a demodulation circuit electrically connected between the radiation detector and the VCO.

16. The method according to claim 15 further comprising steps of sweeping the VCO across a first predetermined band of frequencies at a first predetermined rate with a sweep oscillator means electrically connected to the VCO.

17. The method according to claim 16 further comprising the step of counting the variable output frequency.

18. The method according to claim 15 further including the step of circularly polarizing the radiation produced by the solid state laser.

19. The method according to claim 15 further including the step of energizing the helium cell with rf energy.

* * * * *